United States Patent [19]

Kim

[11] Patent Number: 5,679,972
[45] Date of Patent: Oct. 21, 1997

[54] SEMICONDUCTOR DEVICE

[75] Inventor: Sung Sik Kim, Kyungsangbuk-do, Rep. of Korea

[73] Assignee: LG Semicon Co., Ltd., Chungcheongbuk-Do, Rep. of Korea

[21] Appl. No.: 508,047

[22] Filed: Jul. 27, 1995

Related U.S. Application Data

[62] Division of Ser. No. 429,906, Apr. 27, 1995, Pat. No. 5,538,908.
[51] Int. Cl.$^6$ ............... H01L 27/07; H01L 29/735; H01L 29/94; H01L 29/96
[52] U.S. Cl. ............... 257/378; 257/370; 257/526; 257/513; 257/517; 257/577
[58] Field of Search ............... 257/378, 526, 257/517, 577, 370, 513

[56] References Cited

U.S. PATENT DOCUMENTS

| | | | |
|---|---|---|---|
| 4,243,997 | 1/1981 | Natori et al. | 257/330 |
| 4,825,274 | 4/1989 | Higuchi et al. | 257/378 |
| 4,918,026 | 4/1990 | Kosiak et al. | 257/370 |
| 5,101,257 | 3/1992 | Hayden et al. | 257/378 |
| 5,247,200 | 9/1993 | Momose et al. | 257/378 |
| 5,471,419 | 11/1995 | Sankaranarayanan et al. | 257/378 |

*Primary Examiner*—Jerome Jackson
*Assistant Examiner*—John Guay

[57] ABSTRACT

A semiconductor BiCMOS device and method of manufacturing suitable for attaining high packing density and thereby speeding up a switching operation, wherein the device is formed to have one of a source region or a drain region of an MOS transistor be immediately adjacent a base region of a bipolar transistor so as to be electrically connected. In this manner, an electrical terminal is eliminated, thereby permitting a higher packing density.

21 Claims, 7 Drawing Sheets

SEMICONDUCTOR DEVICE

This application is a divisional of application Ser. No. 08/429,906, filed on Apr. 27, 1995, now U.S. Pat. No. 5,538,908 the entire contents of which are hereby incorporated by reference.

BACKGROUND OF THE INVENTION

1. Field of the Invention

The present invention relates to a structure and a manufacturing method of a semiconductor device, and more particularly, to a device and manufacturing method of a Bipolar CMOS (hereinafter BiCMOS) device suitable for attaining a high packing density.

2. Description of the Related Art

Generally, BiCMOS devices are widely used as high-speed switching elements, and are commonly used in output buffers.

As shown in the circuit diagram of FIG. 1, a conventional BiCMOS device is formed of an NMOS transistor and a PNP transistor.

In more detail, a signal is received via a gate G of the NMOS transistor $Q_1$, and a drain D of the NMOS transistor $Q_1$ is connected to a base B of a PNP transistor $Q_2$. An emitter E of the PNP transistor $Q_2$ is supplied with a constant Voltage $V_{DD}$, and a source S of the NMOS transistor $Q_1$ and a collector C of the PNP transistor Q2 are connected so as to be commonly grounded. Thus, the signal is output via the emitter E of the PNP transistor $Q_2$.

FIG. 2 is a sectional view showing the structure of the BiCMOS device of FIG. 1, and FIGS. 3a–3c are sectional views showing the steps of manufacturing such a device.

As shown in FIG. 2, two p-type wells 3 and 4 are formed in an n-type silicon substrate 1 so as to be separated from each other and electrically isolated by a field oxide layer 2, as illustrated. A gate oxide layer 5 with a gate electrode 6 thereon is formed on the p-type well 3, and high-concentration n-type impurity regions ($n^+$) are formed on each side of the gate electrode 6 in the p-type well 3 so as to provide a source region and a drain region, respectively, of the NMOS transistor $Q_1$. In a portion of the other p-type well 4, an n-type impurity region is implanted. In a portion of the n-type impurity region so formed, a high-concentration n-type impurity is implanted to form an $n^+$ region which serves as a base B. In another portion of the n-type impurity region so formed, a high-concentration p-type impurity is implanted to form a $p^+$ region which serves as the emitter E. In another portion of the p-type well 4, a high-concentration p-type impurity region $p^+$ is implanted to serve as the collector C. On the surface of the n-type region between the base B and the emitter E, and on the surface of the p-type well 3 between the emitter E and collector C, an oxide layer 7 is formed to electrically isolate the emitter E, base B and collector C which form the PNP transistor $Q_2$.

A method of manufacturing the BiCMOS device of FIGS. 1 and 2 will now be described.

As illustrated in FIG. 3a, the field oxide layer 2 is formed in the n-type silicon substrate 1 so as to define formation regions of the NMOS transistor $Q_1$ and the PNP transistor $Q_2$. Then, p-type well 3 and p-type collector 4 are formed in the NMOS transistor formation region and PNP transistor formation region, respectively, via p-type ion implantation and diffusion.

Referring to FIG. 3b, a gate oxide layer 5 is grown in the NMOS transistor region, and polysilicon is deposited to form a gate electrode 6 via a photolithography process. Low-concentration n-type ions are implanted into a predetermined region within the p-collector 4 of the PNP transistor $Q_2$ to form the region n. Then high-concentration n-type ($n^+$) ions are implanted into the p-type well 3 on each side of the gate electrode 6 to form a source region and a drain region, respectively. Also low-concentration n-type ions are implanted into a predetermined region within the p-collector 4 of the PNP transistor $Q_2$ to form the region n.

As illustrated in FIG. 3c, high-concentration p-type ($p^+$) ions are implanted into one side of the source region of the NMOS transistor $Q_1$, as well as into a portion of the region n and a portion of the p-type well 4 so as to form the emitter E and collector C of the PNP transistor $Q_2$. Then oxide layers 7 are grown between the base B, emitter E and collector C to electrically isolate these regions.

In the conventional BiCMOS device formed as above, the drain of the NMOS transistor $Q_1$ is connected to the base B of the PNP transistor $Q_2$, the gate electrode 6 of the NMOS transistor $Q_1$ is set as an input terminal, and the emitter E of the PNP transistor $Q_1$ is set as an output terminal so that the circuit as shown in FIG. 1 is obtained.

Therefore, the output electrode can be switched between two values by a signal supplied to the input electrode.

The conventional BiCMOS device, however, is disadvantageous in that a contact electrode is formed to serve as a terminal for each of the source S, drain D and gate G of the NMOS transistor and for each of the emitter E, collector C and base B of the PNP transistor $Q_2$ so as to permit each terminal to be externally connected. As a result, it is difficult to increase the packing density and switching speed.

SUMMARY OF THE INVENTION

The present invention is devised to solve the above-described problems. Accordingly, it is an object of the present invention to provide a more highly-integrated BiCMOS device.

To achieve the above object of the invention, there is provided a semiconductor device in which a drain region of an MOS transistor is immediately adjacent a base region of a bipolar transistor so as to be electrically connected to the base. In the alternative, there is provided a semiconductor device in which a source region of an MOS transistor is immediately adjacent a base region of a bipolar transistors as to be electrically connected to the base. There is also provided a method for manufacturing a semiconductor device which includes forming one of a drain region or a source region of an MOS transistor immediately adjacent a base region of a bipolar transistor so as to be electrically connected.

Further scope of applicability of the present invention will become apparent from the detailed description given hereinafter. However, it should be understood that the detailed description and specific examples, while indicating preferred embodiments of the invention, are given by way of illustration only, since various changes and modifications within spirit and scope of the invention will become apparent to those skilled in the art from this detailed description.

BRIEF DESCRIPTION OF THE DRAWINGS

The above object and advantage of the present invention will become more apparent by describing in detail preferred embodiments thereof with reference to the attached drawings in which:

FIG. 1 is a circuit diagram of a conventional BiCMOS device;

FIG. 2 is a sectional view showing the structure of the conventional BiCMOS device of FIG. 1.

DETAILED DESCRIPTION OF THE PREFERRED EMBODIMENT

Figure 3A:
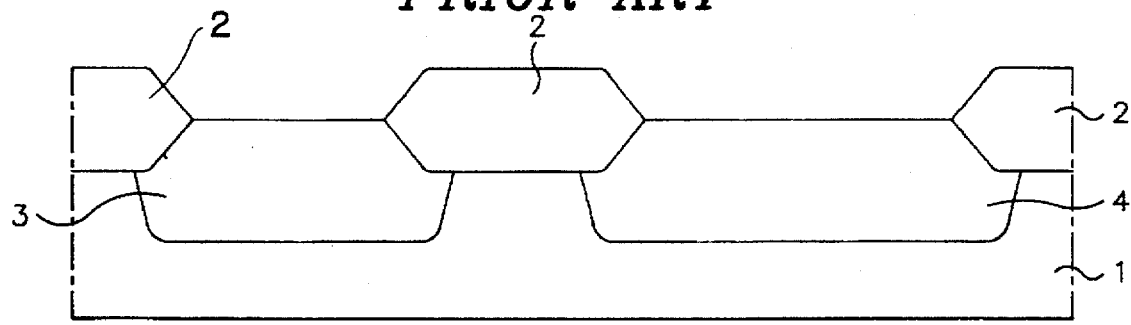
FIGS. 3a to 3c are sectional views showing manufacturing steps of the conventional BiCMOS device of FIG. 2.
Figure 3B:
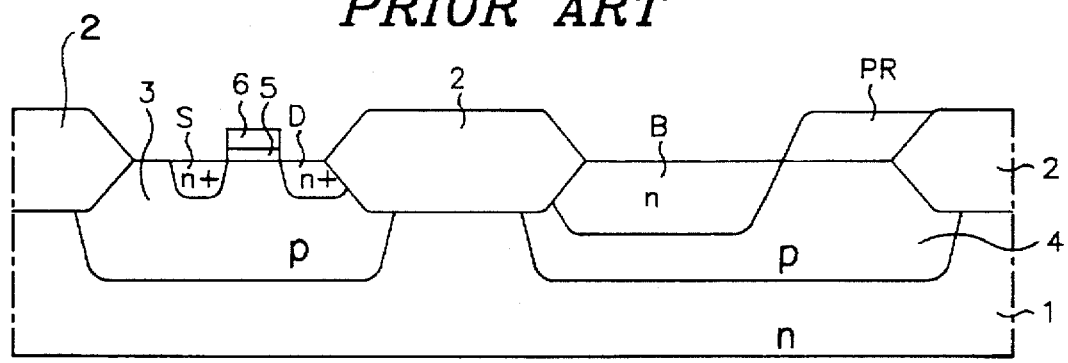
Figure 3C:
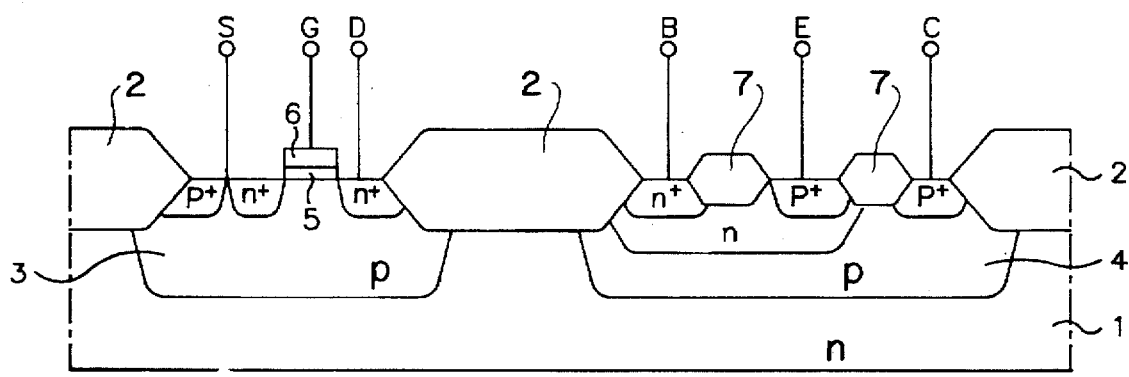
Figure 4A:
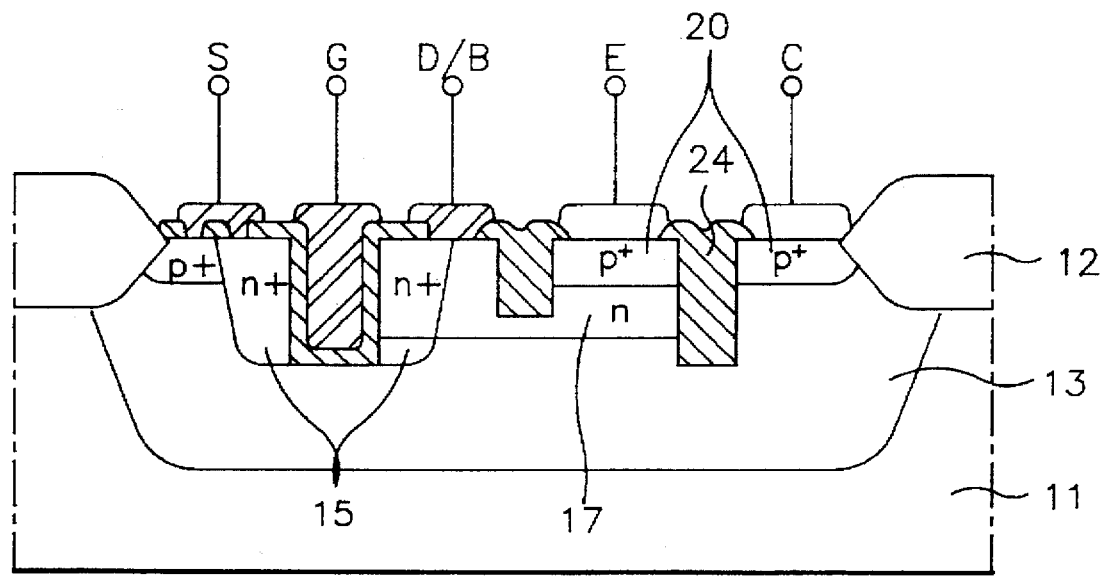
FIGS. 4a and 4b are sectional views showing a structure of a BiCMOS device according to a first embodiment and second embodiment of the present invention, respectively.

Referring to FIGS. 4a and 5, one preferred embodiment of a BiCMOS device according to the present invention will be described. As shown in FIG. 4a, a field oxide layer 12 is formed in an n-type silicon substrate 11 to define a field region and to electrically isolate an active region. A p-type well 13 is formed in the n-type silicon substrate 11 of the active region, and a trench is formed in an NMOS transistor formation region in the p-type well 13 to form a formation region for what will become a gate electrode G inside the trench. Then, high-concentration n-type ($n^+$) impurity regions 15 forming a source and a drain region, respectively, are provided on either side of the trench having the gate electrode G therein.

A PNP transistor base region 17 is formed immediately adjacent to the drain region 15 of the NMOS transistor formation region so as to be electrically connected thereto and provide a low-concentration n-type (n) impurity region within the p-type well 13. In addition to the base region 17, a high-concentration p-type ($p^+$) impurity region 20 is formed in a predetermined portion within the base region 17 so as to be an emitter region E, and the high-concentration p-type ($p^+$) impurity region 20 is formed on the p-type well 13 at one side of the emitter region E so as to be a collector region C.

The emitter region E, base region B, and collector region C are electrically isolated from each other by means of an oxide layer 24 formed within a trench.

Hereinafter, a method for manufacturing a BiCMOS device having the above-stated structure will be described.

Figure 5A:
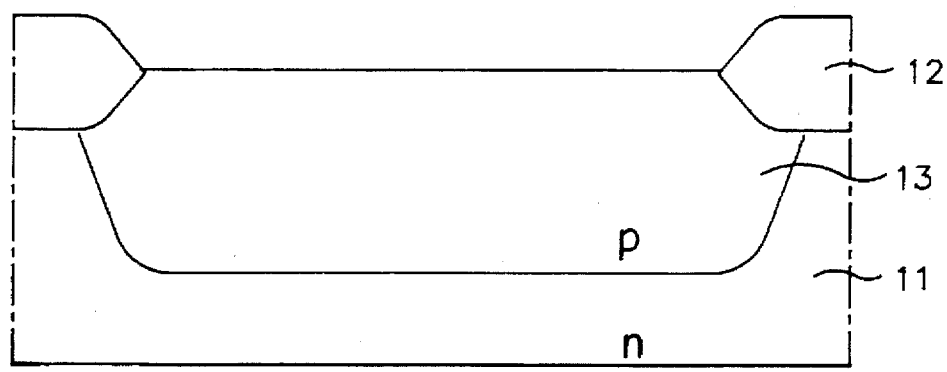
FIGS. 5a to 5i are sectional views showing manufacturing steps of the BiCMOS device according to the embodiments of the present invention.

Referring to FIG. 5a, the field oxide layer 12 is formed in an n-type silicon substrate 11 to define a field region and to electrically isolate an active region. A p-type impurity is ion-implanted to the active region and a drive-in process is performed to form the p-type well 13.

Figure 5B:
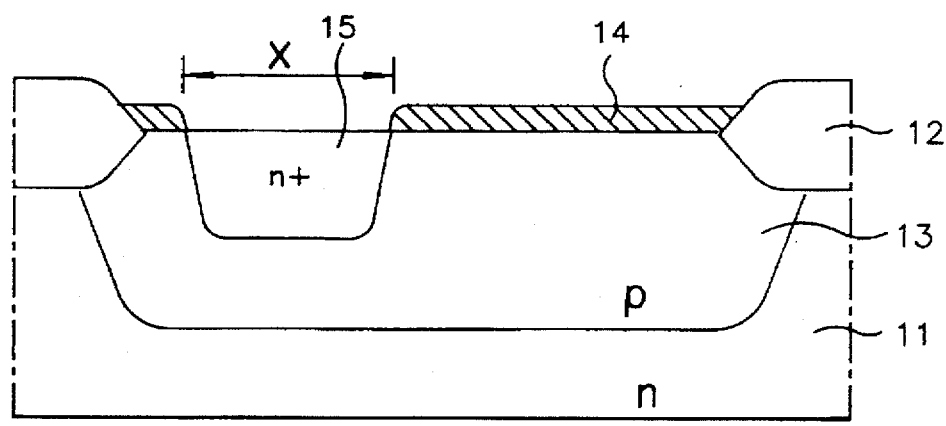
Figure 5C:
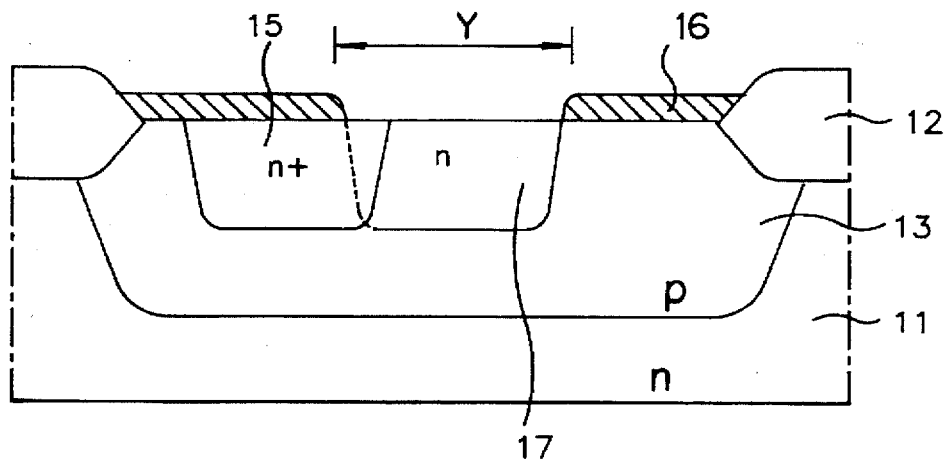

In FIG. 5b, a first photoresist layer 14 is deposited on the entire surface of the resultant structure, which is exposed and developed to form the formation region X of the NMOS transistor. Successively, high-concentration n-type ($n^+$) ions are implanted into the formation region X of the NMOS transistor through the surface of the p-type well 13 to thereby form the high-concentration n-type ($n^+$) impurity region 15, Referring to FIG. 5c a second photoresist layer 16 is then deposited on the entire surface of the resultant structure, exposed and developed to form a formation region Y. After ion-implanting the low-concentration n-type (n) impurity ions to the formation region Y so as to form the low-concentration n-type (n) impurity region 17, the photoresist layer 16 is then removed.

At this time, it should be noted that what is to become the drain in formation region X of the NMOS transistor and the base in formation region Y of the bipolar transistor are connected to each other.

Figure 5D:
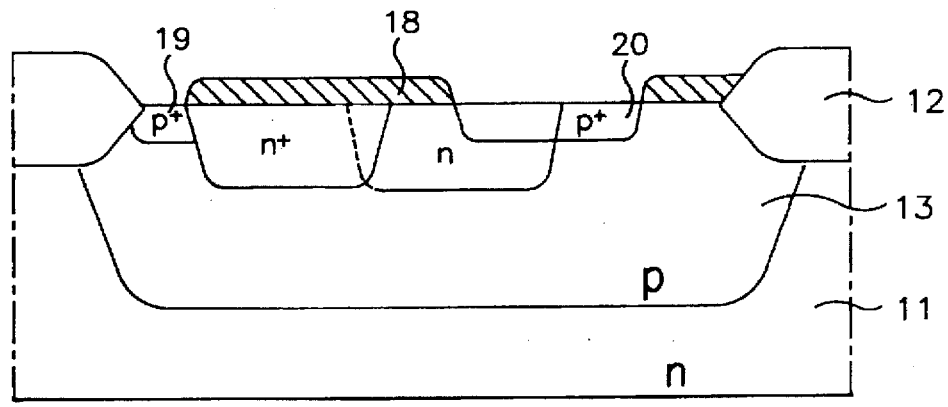

Referring to FIG. 5d, a third photoresist layer 18 is deposited on the entire surface of the resultant structure, and an exposure & development process is performed to expose a portion of the formation region X of the NMOS transistor a portion of, the formation region Y of the PNP transistor, and the p-type well 13 on one side of the formation region Y of the PNP transistor.

After this, high-concentration p-type ($p^+$) ions are implanted into the exposed portions to form the high-concentration $p^+$-type impurity regions 19 and 20, and the third photoresist layer 18 is removed.

Figure 5E:
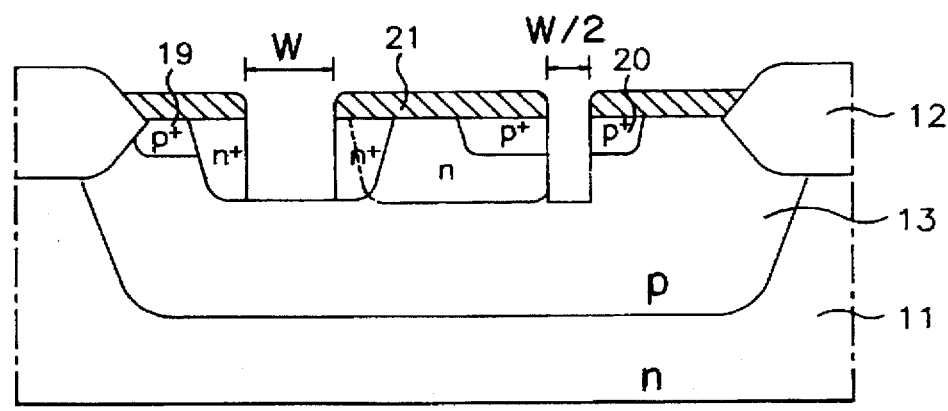

As illustrated in FIG. 5e, a fourth photoresist layer 21 is deposited on the entire surface of the resultant structure, and patterned to expose a central portion of the formation region X of what is to become the NMOS transistor and a boundary portion at one side of the base/emitter formation region Y of what is to become the PNP transistor.

Here, the pattern width W at the formation region X of the NMOS transistor is formed so as to be about two times the pattern width W2 at one side of the formation region Y of the PNP transistor.

Using the fourth photoresist layer 21 as a mask, the structure is etched to form trenches, as illustrated in FIG. 5e. Thus, what are to become the source and the drain regions of the NMOS transistor and the collector/emitter of the PNP transistor are separated from each other.

Figure 5F:
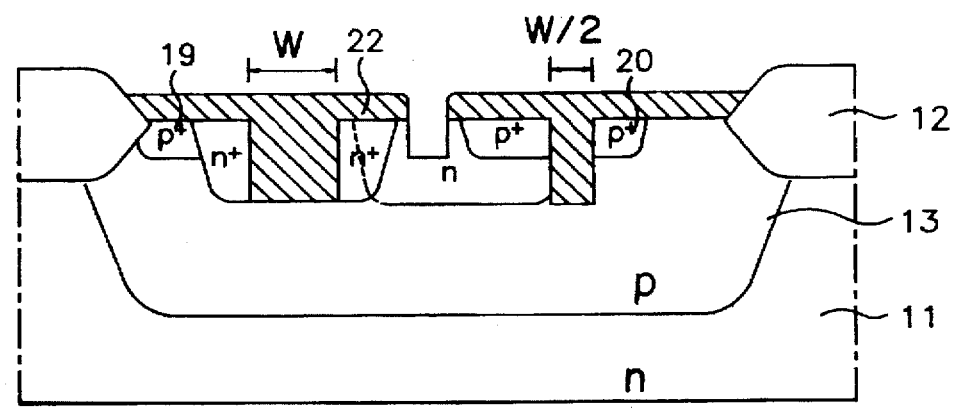
Figure 5D:
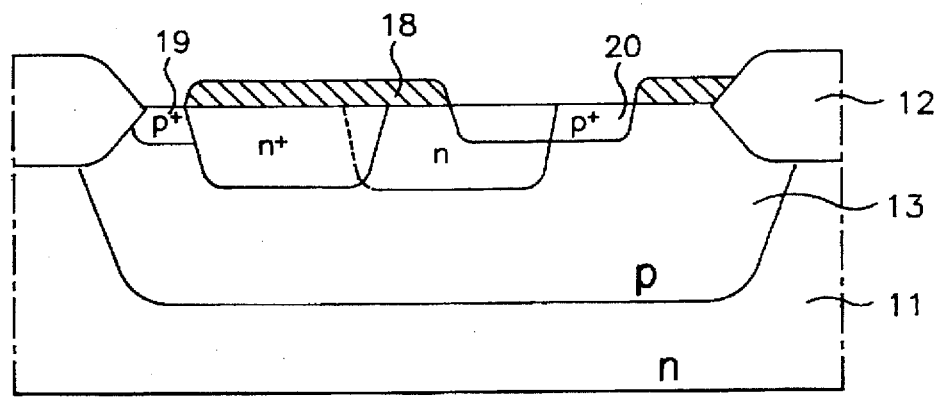
Figure 5E:
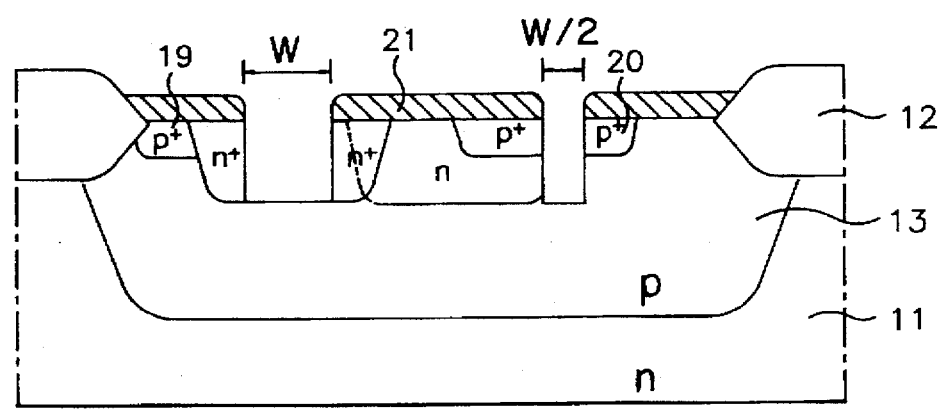
Figure 5F:
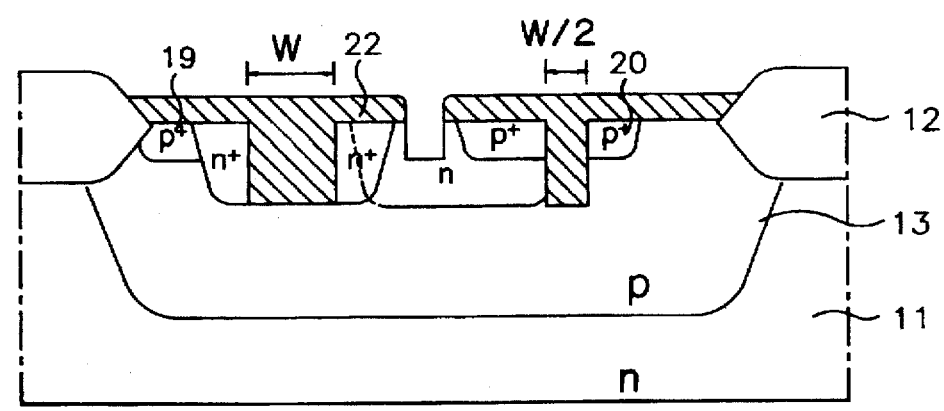

As shown in FIG. 5f, the fourth photoresist layer 21 is removed, a fifth photoresist layer 22 is deposited on the entire surface of the structure, and the base/emitter formation region Y of the PNP transistor is patterned to expose a portion between what is to become the base B and emitter E. The exposed portion is etched to a predetermined depth, and the fifth photoresist layer 22 is removed. The pattern width W2 is the same as that at the boundary portion of said one side of the formation region Y of the PNP transistor, and the trench here is more shallow than the foregoing trench.

Figure 5G:
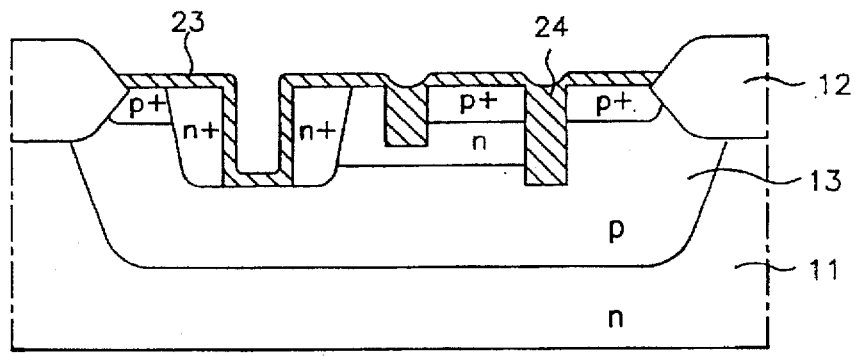

In FIG. 5g, a gate insulating layer 23 is formed on the NMOS transistor formation region, and a thick insulating layer 24 is formed on the PNP transistor formation region to fill up the trench of the bipolar transistor.

Figure 5H:
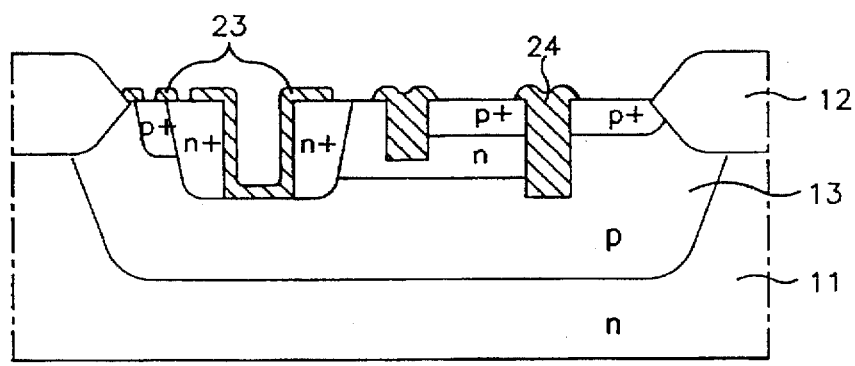

Referring to FIG. 5h, contact holes are formed in the gate insulating layer 23 for forming respective electrodes in the source region, drain/base region, and emitter/collector region.

Figure 5I:
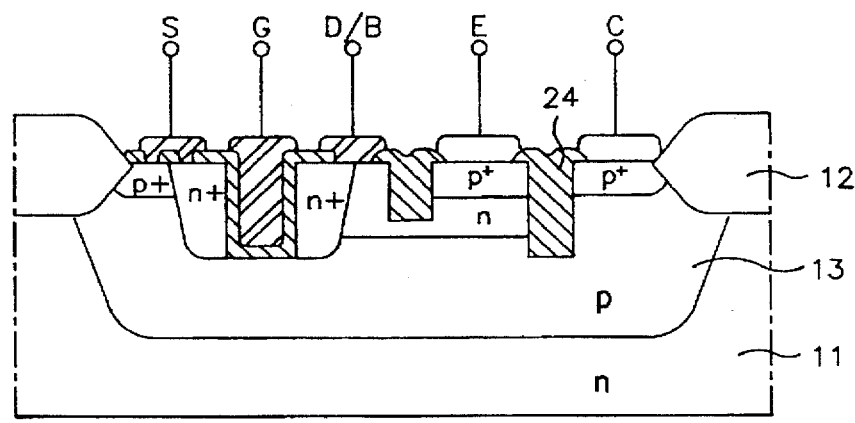

As illustrated in FIG. 5i, the trench of what is to become the gate electrode of the NMOS transistor if filled with polysilicon, and polysilicon for forming electrodes is formed on the surface of the resultant structure, and is patterned to form a source electrode S, gate electrode G, a drain/base electrode D/B, an emitter electrode E, and collector electrode C.

Figure 4B:
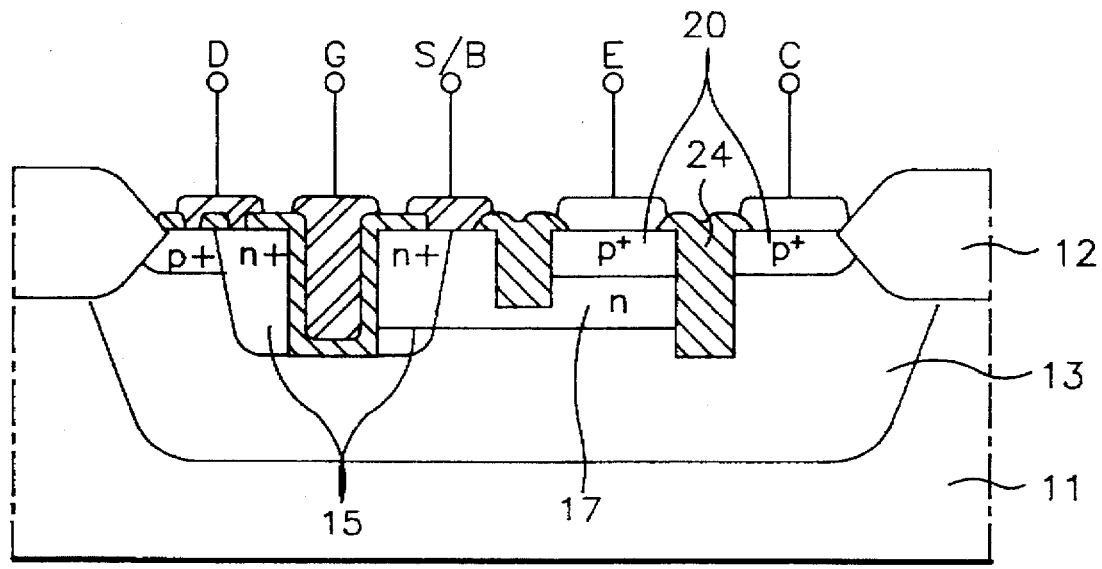

The operation of the BiCMOS device according to the present invention constructed as above is the same as the conventional one, and thus will be omitted. Further the making of the device of FIG. 4b is similar to that of FIG. 4a except that the source and drain of the CMOS transistor are reversed, and thus further description will be omitted.

Figure 6:
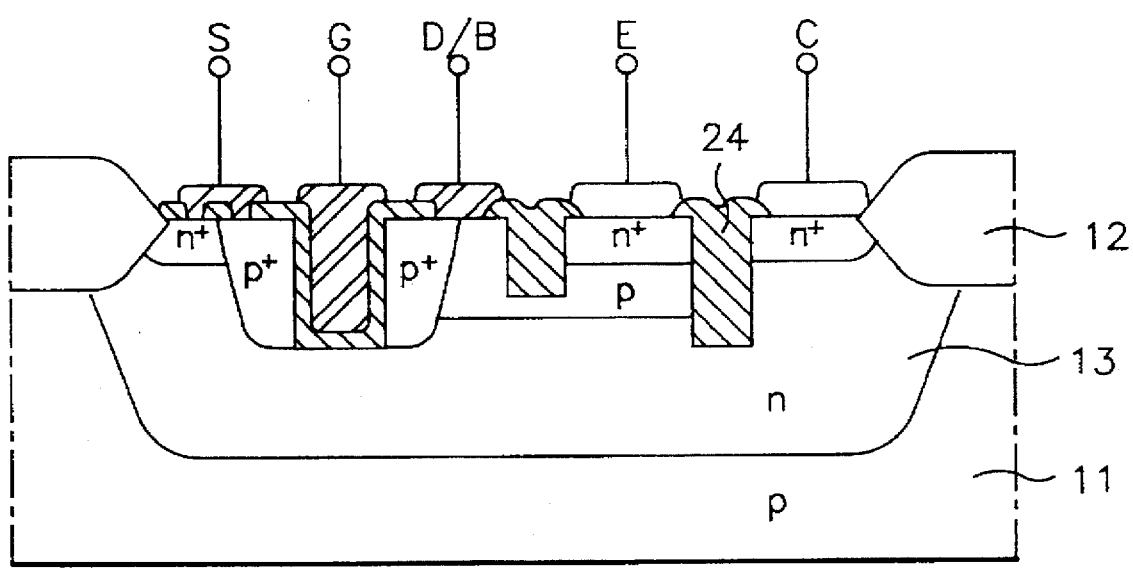
FIG. 6 illustrates another embodiment of the present invention in which the BICMOS device using a PMOS transistor and NPN bipolar transistor are formed.

As illustrated in FIG. 6, as those of ordinary skill in the art would appreciate, it is of course possible to make the present invention using a PMOS transistor and an NPN transistor. As the manner of making this is similar to that described above for the CMOS transistor and PNP transistor except for using layers of opposite impurity concentration, a detailed explanation will be omitted.

As described above, a semiconductor device structure and method of manufacturing according to the present invention is advantageous in that a gate electrode is formed within a trench, and one of a drain or source of an MOS transistor and a base of a bipolar transistor are formed immediately adjacent one another so as to be electrically connected. As a result, high packing density is achieved to decrease the chip size as well as to speed up the switching operation.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A semiconductor device comprising:
   a substrate being a semiconductor of a first conductivity type;
   a field oxide layer forming a field region, which electrically isolates an active region on said semiconductor substrate;
   a well of a second conductivity type, formed in said active region;
   an MOS transistor including a source, a gate and a drain on said substrate;
   a BIPOLAR transistor including an emitter, a base and a collector on said substrate, the drain of said MOS transistor being immediately adjacent the base of said BiPolar transistor so as to make electrical contact therewith, a portion of said base being formed between said gate and said emitter; and
   a first trench filled with an electrical insulator material between said base and said emitter,
   said source and said drain each having a high impurity concentration of said first conductivity type and positioned on respective sides of said gate,
   said base of said BIPOLAR transistor having a low impurity concentration of said first conductivity type and connected to said drain of said MOS transistor,
   said emitter having a high impurity concentration of said second conductivity type and formed above a portion of said base,
   a portion of said collector being separated from a portion of said emitter by a third trench filled with an electrical insulator material,
   wherein an end portion of said emitter and an end portion of said base are aligned vertically, so as to form one side of said third trench.

2. The device as claimed in claim 1, wherein said gate of said MOS transistor is formed within a second trench in said MOS transistor.

3. The device as claimed in claim 2, wherein said second trench in which the gate is formed is about two times as wide as either said first trench between the base and the emitter or said third trench between the emitter and the collector.

4. The device as claimed in claim 1, said MOS transistor being an NMOS transistor and said BiPolar transistor being an PNP transistor.

5. The device as claimed in claim 1, said MOS transistor being a PMOS transistor and said BiPolar transistor being an NPN transistor.

6. The device as claimed in claim 1, further comprising:
   a conducting material formed on each of said gate, said source, said emitter and said collector, which serves as a terminal for each, of said gate, said source, said emitter, and said collector.

7. A semiconductor device comprising:
   a substrate being a semiconductor of a first conductivity type;
   a field oxide forming a field region, which electrically isolates an active region on said semiconductor substrate;
   a well of a second conductivity type, formed in said active region;
   an MOS transistor including a source, a gate, and a drain on said substrate;
   a BiPolar transistor including an emitter, a base and a collector on said substrate, said source of said MOS transistor being immediately adjacent the base of said Bipolar transistor so as to make electrical contact therewith, a portion of said base being formed between said gate and said emitter; and
   a first trench filled with an electrical insulator material between said base and said emitter,
   said source and said drain each having a high impurity concentration of said first conductivity type and positioned on respective sides of said gate,
   said base of the BIPOLAR transistor having a low impurity concentration of said first conductivity type and connected to said drain of said MOS transistor,
   said emitter having a high impurity concentration of said second conductivity type and formed above a portion of said base,
   a portion of said collector being separated from a portion of said emitter by a third trench filled with an electrical insulator material,
   wherein an end portion of said emitter and an end portion of said base are aligned vertically, so as to form one side of said third trench.

8. The device as claimed in claim 7, wherein said gate of said MOS transistor is formed within a second trench in said MOS transistor.

9. The device as claimed in claim 8, wherein said second trench in which the gate is formed is about two times as wide as either said first trench between the base and the emitter or said third trench between the emitter and the collector.

10. The device as claimed in claim 7, further comprising:
    a conducting material formed on each of said gate, source, emitter and collector, which serves as a terminal for each of said gate, said source, said emitter, and said collector.

11. The device as claimed in claim 7, wherein said MOS transistor is an NMOS transistor and said BiPolar transistor is a PNP transistor.

12. The device as claimed in claim 7, wherein said MOS transistor is a PMOS transistor and said BiPolar transistor is an NPN transistor.

13. A semiconductor device comprising:
    a substrate;
    an MOS transistor including a source, a gate, and a drain on said substrate;
    a BiPolar transistor including an emitter, a base, and a collector on said substrate, one of said drain and said source of said MOS transistor being immediately adjacent said base of said BiPolar transistor so as to make electrical contact therewith, a portion of said base being formed between said gate and said emitter; and a first trench filled with an electrical insulator material between said base and said emitter of said BiPolar transistor, wherein an end portion of said emitter and an end portion of said base are vertically aligned as to form one side of a third trench filled with an electrical insulator material for separating said emitter and said collector.

14. The device as claimed in claim 13, wherein said gate of said MOS transistor is formed within a second trench in said MOS transistor, and a portion of said collector is separated from a portion of said emitter by a third trench filled with an electrical insulator material.

15. The device as claimed in claim 14, wherein said second trench is about two times as wide as either said first trench between said base and said emitter or said third trench between said emitter and said collector.

16. The device as claimed in claim 13, further comprising:

said substrate being a semiconductor of a first conductivity type;

a field oxide layer forming a field region, which electrically isolates an active region on said semiconductor substrate; and a well of a second conductivity type formed in said active region.

17. The device as claimed in claim 16, further comprising:

said source and said drain each having an impurity concentration of said first conductivity type and positioned on respective sides of said gate; and said base of said BiPolar transistor having a lower impurity concentration of said first conductivity type and connected to said drain of said MOS transistor.

18. The device as claimed in claim 16, further comprising:

said emitter having a high impurity concentration of said second conductivity type and formed above a portion of said base; and a portion of said collector being separated from a portion of said emitter by a second trench filled with an electrical insulator material.

19. The device as claimed in claim 13, further comprising:

a conducting material formed on each of said gate, said source, said emitter and said collector, which serves as a terminal for each of said gate, said source, said emitter, and said collector.

20. The device as claimed in claim 13, wherein said MOS transistor is an NMOS transistor and said BiPolar transistor is a PNP transistor.

21. The device as claimed in claim 13, wherein said MOS transistor is a PMOS transistor and said BiPolar transistor is an NPN transistor.

* * * * *